United States Patent [19]
Yamazaki et al.

[11] Patent Number: 5,486,733
[45] Date of Patent: Jan. 23, 1996

[54] BONDING APPARATUS

[75] Inventors: Nobuto Yamazaki, Higashi; Ryuichi Kyomasu, Kodaira, both of Japan

[73] Assignee: Kabushiki Kaisha Shinkawa, Tokyo, Japan

[21] Appl. No.: 365,055

[22] Filed: Dec. 28, 1994

Related U.S. Application Data

[63] Continuation of Ser. No. 172,028, Dec. 22, 1993, abandoned.

[30] Foreign Application Priority Data

Dec. 24, 1992 [JP] Japan ..................... 4-357385

[51] Int. Cl.⁶ ........................................... H03H 9/05
[52] U.S. Cl. ................ 310/323; 310/328; 228/11; 228/110.1
[58] Field of Search ....................... 310/323, 325; 228/1.1, 110.1

[56] References Cited

U.S. PATENT DOCUMENTS

| | | | |
|---|---|---|---|
| 3,184,842 | 5/1965 | Maropis | 228/1.1 |
| 3,368,085 | 2/1968 | McMaster et al. | 310/325 |
| 3,511,323 | 5/1970 | Riley | 310/323 |
| 3,602,420 | 8/1971 | Wilkinson | 228/1 |
| 3,681,627 | 8/1972 | Murry et al. | 310/325 |
| 3,756,575 | 9/1973 | Cottell | 261/1 |
| 3,772,538 | 11/1973 | Supitilov | 310/325 |
| 3,931,921 | 1/1976 | Antonevich | 228/1.1 |
| 4,290,074 | 9/1981 | Royer | 310/323 |
| 4,647,336 | 3/1987 | Coenen et al. | 156/580.1 |
| 4,975,133 | 12/1990 | Gochermann | 156/73.1 |
| 5,148,964 | 9/1992 | Shimizu | 228/1.1 |
| 5,176,677 | 1/1993 | Wuchinich | 606/46 |

FOREIGN PATENT DOCUMENTS

| | | | |
|---|---|---|---|
| 0632119 | 12/1961 | Canada | 228/110.1 |
| 0288483 | 3/1991 | Germany | 228/1.1 |
| 0217984 | 9/1988 | Japan | 310/325 |
| 5055311 | 3/1993 | Japan | 228/1.1 |

OTHER PUBLICATIONS

"Straight Line Motion Of A Vibratory Bonding Tool" by F. Christensen et al. Western Electric Technical Digest No. 4, Oct. 1966, p. 21.
"Ultrasonic Bonding Tool" by P. Smith, IBM Technical Disclosure Bulletin, vol. 13, No. 10 Mar. 1971, p. 2862.

Primary Examiner—Thomas M. Dougherty
Attorney, Agent, or Firm—Koda and Androlia

[57] ABSTRACT

A bonding apparatus with an ultrasonic horn for manufacturing, for example, semiconductor devices having a horn support that is used for mounting the ultrasonic horn to a bonding arm of the bonding apparatus, and tow vibration-generating sources are provided on both sides of the horn support. The vibration-generating sources are such a piezoelectric element as an electrostrictive strain element and a magnetostrictor.

3 Claims, 2 Drawing Sheets

BONDING APPARATUS

This is a continuation of application Ser. No. 08/172,028, filed Dec. 22, 1993 now abandoned.

BACKGROUND OF THE INVENTION

1. Field of the Invention

The present invention relates to a bonding apparatus and more particularly to a bonding apparatus provided with an ultrasonic bonding horn used in manufacturing of, for example, semiconductor devices.

2. Prior Art

One type of conventional bonding apparatus, a nailhead heat-and-pressure bonding type wire bonding apparatus, is shown in FIG. 7.

In this wire bonding apparatus, a supporting shaft 2 is fastened to a bonding arm 1 and is supported on a bonding head (not shown) either directly or via a lifter arm in a rotatable fashion. The horn support 4 of an ultrasonic horn 3 is mounted to the bonding arm 1. The ultrasonic horn 3 includes a horn body 6 which has a capillary 5 at one end and a vibrator 7 at another end. The vibrator 7 is screw-connected to the horn body 6. A bonding wire (not shown) passes through the capillary 5.

More specifically, the vibrator 7 includes a vibration-generating source 8 that is secured by screws. This screw installation is called a "Langevin" method. The vibrator 7 includes: a horn attachment 9 which is screw-connected to the horn body 6, a vibration-generating source attachment shaft 10 which has a threaded portion formed on both ends and is screw-connected to the horn attachment 9, an insulating pipe 11 which is fitted over the vibration-generating source attachment shaft 10, a vibration-generating source 8 which is obtained from a plurality of stacked doughnut-shaped electrostrictive strain elements or magnetostrictors that are fitted over the insulating pipe 11, and a nut 12 which is screw-connected to the vibration-generating source attachment shaft 10 so that the vibration-generating source 8 is tightened and secured between the nut 12 and the horn attachment 9.

In this conventional ultrasonic horn 3, the vibration-generating source 8 is located on the opposite side of the horn support 4 from the capillary 5. In other words, the vibration-generating source 8 is provided across from the capillary 5. The frequency of the vibrator 7 is adjusted to a desired level by the horn attachment 9 and the nut 12. The acoustic length of the vibrator 7 needs to be an integral multiple of ½ of the wavelength. Since there is no reason to use a lengthy vibrator, the vibrator 7 of the length equal to ½ of the wavelength is utilized. Furthermore, the free end 13 of the vibrator 7 acts as a vibrational antinode, and the horn attachment portion 14 of the horn attachment 9 acts as a vibrational antinode. Thus, the attachment of the vibrator 7 and the horn attachment 9 is facilitated.

In use, the vibration of the vibration-generating source 8 is transmitted throughout the entire ultrasonic horn 3 so that a standing-wave vibration is created in the ultrasonic horn 3, and the required energy is supplied to the capillary 5. In a non-loaded state (i.e., when bonding is not being performed), the energy accumulates in a stable manner. In addition, the horn 3 (particularly a skillfully crafted ultrasonic horn) is designed dimension-wise so that a node is formed in the horn support 4. Thus, the amount of movement of the horn support 4 is small and the loss of the movement is small even though the ultrasonic horn 3 is mounted to the bonding arm 1. In this non-loaded state, the ultrasonic horn 3 acts like a tuning fork, and the horn support 4 receives vibrations in a symmetrical manner from the left and right sides so that there is no movement to the left or right. The vibration-generating source 8 is ordinarily driven by constant-current driving, etc. so that the amplitude is kept at a prescribed value. When the energy is used for bonding via the capillary 5, the energy equilibrium between the vibration-generating source side and the capillary side loses its balance, and the node of vibration moves, and the energy required for equilibrium is fed in. An ultrasonic bonding is thus performed.

In the conventional ultrasonic horn 3, the vibration-generating source 8 is provided on the opposite side of the horn support 4 from the capillary 5. Accordingly, the energy of the vibration-generating source 8 passes through the horn support 4. Thus, when the vibration energy is consumed by bonding on the capillary side, the energy passing through the horn support 4 is subject to the influence of energy loss which fluctuates greatly according to the structure of the horn support 4, and the energy becomes unstable. The energy loss of the horn support 4 tends to fluctuate greatly when the amount of energy passing through the horn support 4 is large. Accordingly, it is difficult to ascertain the actual loaded conditions from the characteristics of the ultrasonic horn when it is in a non-loaded (or non-bonding) state.

The facts will be described below to a greater extent.

In the non-loaded state (or bonding is not being performed), energy from both sides of the horn support 4 causes distortion with the center of the horn support 4 forming a vibrational node; as a result, the horn support 4 does not move in the axial direction of the ultrasonic horn 3. The reason that the horn support 4 is selected to act as a supporting point is that a minimal energy loss is expected here because of a lack of minimal mechanical vibration. A well-crafted ultrasonic horn is stable in a non-loaded state and shows little loss. During the bonding operation, however, energy is consumed on the capillary side; as a result, the energy balance on both sides of the horn support 4 is destroyed, and vibration occurs in the horn support 4. Consequently, frictional movement occurs between the bonding arm 1 and the horn support 4, so that the relationship between the energy applied to the vibrator 7 and the energy used in the assembly of semiconductor devices is destroyed, lowering the bonding quality.

The energy consumed by the fixed parts of the horn support 4 and capillary 5 cannot be distinguished from the energy consumed in the actual bonding part. Accordingly, bonding under optimal conditions can only be accomplished by adjusting the current applied to the vibration-generating source 8 and the time of current application while examining the actual bonding results. However, the energy which is used needlessly for this purpose is unstable, and the energy used for bonding is also unstable.

In the conventional ultrasonic horn 3, when energy loss occurs during bonding so that the vibrational energy becomes insufficient on the capillary side of the horn support 4, the left-right equilibrium of the horn support 4 is destroyed, and the horn support 4, which is originally supposed to act as a vibrational node, cannot remain static and instead begins to move. As a result, the ultrasonic energy applied is converted into thermal energy between the horn support 4 and the bonding arm 1 or escapes into the bonding arm 1 and the parts attached to the bonding arm 1, thus causing the bonding arm 1, etc. to vibrate. All energy which is accumulated, consumed or released due to such unexpected causes leads to a deterioration in the bonding quality.

Another factor that causes deterioration of the bonding quality is variations in the frequency and impedance of the vibrator. The vibrator 7 shows a frequency variation of several hundred hertz between its minimal-amplitude and its maximum-amplitude. In the conventional structure, the vibration-generating source 8 is installed on one side of the horn support 4; accordingly, the frequency tends to be shifted on the two sides of the horn support 4. Even if there are two frequencies, vibration is actually performed at one frequency or the other. Accordingly, the amplitude of the capillary 5 varies greatly between cases where the vibration occurs at the frequency on the capillary side and cases where the vibration occurs at the frequency on the vibrator side. Furthermore, during actual bonding, the frequency may change suddenly according to fluctuations in the conditions, thus leading to defective bonding.

SUMMARY OF THE INVENTION

The object of the present invention is to provide a bonding apparatus equipped with an ultrasonic horn that can provide an improved bonding stability.

The present invention can be utilized in a heat-and-pressure bonding type wire bonding apparatus which uses nailhead ultrasonic waves, an ultrasonic wedge type wire bonding apparatus, a single tab bonding apparatus, and other types of bonding apparatuses that include an ultrasonic horn having a bonding tool and a vibration-generating source such as an electrostrictive strain element, a magnetostrictor, etc.

The object of the present invention is accomplished by a unique structure for a bonding apparatus in which an ultrasonic horn, that includes a bonding tool at its one end and a vibration-generating source, is mounted to a bonding arm, and wherein the ultrasonic horn further comprises a horn support, which is for mounting the ultrasonic horn to the bonding arm, and vibration-generating sources which are provided on both sides of this horn support.

In the above and through out the following disclosure in this specification, the vibration-generating source refers to a piezoelectric element such as an electrostrictive strain element, a magnetostrictor, etc.

In addition, the object of the present invention is accomplished by another unique structure for a bonding apparatus in which an ultrasonic horn, that includes a bonding tool at its one end and a vibration-generating source, is mounted to a bonding arm, and wherein the ultrasonic horn further comprises a horn support, which is for mounting the ultrasonic horn to the bonding arm, and a vibration-generating source provided only on one side of the horn support. In other words, a single vibration-generating source is provided between the bonding tool and the horn support.

Furthermore, the object of the present invention is accomplished by still another unique structure for a bonding apparatus in which an ultrasonic horn, that includes a bonding tool at its one end and a vibration-generating source, is mounted to a bonding arm, and wherein the ultrasonic horn further comprises a horn support that is for mounting the ultrasonic horn to the bonding arm, the horn support is provided with vibration-generating source attachment shafts on its both sides and threaded portions formed at the ends of the attachment shafts, and vibration-generating sources are provided on these attachment shafts so that the vibration-generating sources are located on both sides of the horn support. The horn support is screw connected to the ultrasonic horn via the threaded portions of the attachment shafts.

With the above three structures, the vibrational energy from the vibration-generating source installed on the bonding tool side of the horn support has no need to pass through the horn support. Accordingly, needless movement of the horn support accompanying the transfer of energy to the bonding tool can be reduced. Furthermore, according to the first and third structures in the above, since fluctuations in the characteristics of the vibration-generating sources themselves are almost symmetrical on both sides of the horn support, the effect of such fluctuations on the horn support can be reduced.

In addition, the third structure has further advantages, since the horn support is firmly fastened to the main body of the horn directly by mechanical means (thread-connection), there is no slipping of the horn support. In the meanwhile, the horn support can act as a vibrational node and show a large strain. Thus, it is preferable that the threaded portions be formed as close as possible to where the vibrational node occurs. If the positions of the threaded portions are set so that the distance of the threaded portions from the horn support is equal to approximately ¼ of the wavelength, the vibrational efficiency of the vibration-generating sources can be improved.

DETAILED DESCRIPTION OF THE INVENTION

Figure 1:
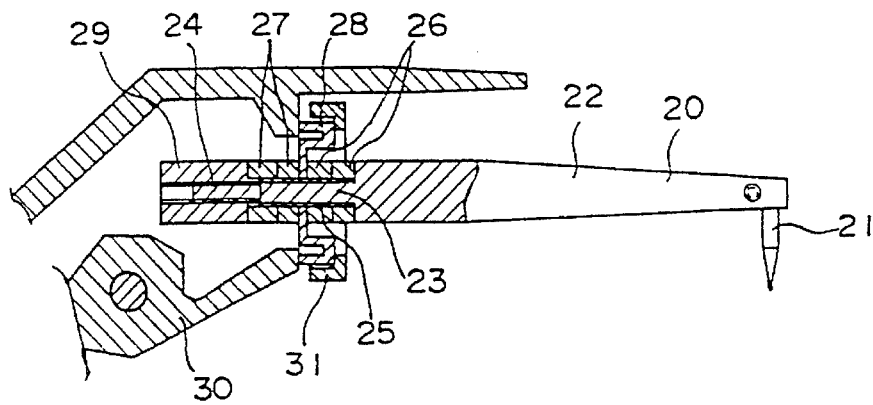
FIG. 1 is a cross section of essential portions of a first embodiment of the ultrasonic horn of a bonding apparatus according to the present invention.

The first embodiment of the present invention will be described with reference to FIGS. 1 and 2.

The ultrasonic horn 20 includes a horn body 22, which has a capillary 21 at one end. The horn body 22 has a vibration-generating source attachment shaft 23 on the other end, and a threaded portion 24 is extended from the end of the vibration-generating source attachment shaft 23. An insulating pipe 25 is fitted over the vibration-generating source attachment shaft 23.

Two vibration-generating sources 26 and 27 are fitted over the insulating pipe 25. Each one of the vibration-generating sources consists of a plurality of electrostrictive strain elements, magnetostrictors, etc. In this embodiment, two vibration-generating elements are used. In addition, a horn support 28 is installed over the insulating pipe 25 so that the horn support is sandwiched by the vibration-generating sources 26 and 27. Furthermore, the vibration-generating sources 26 and 27 and the horn supporting part 28 are all secured to the horn body 22 via a nut 29 which is screwed onto the threaded portion 24 of the horn body 22. The horn support 28 is held between a bonding arm 30 and a fastening plate 31, and the fastening plate 31 is fastened to the bonding arm 30 by screws 32, so that the horn support 28 is mounted to the bonding arm 30.

In operation, since vibration-generating sources 26 and 27 are secured on both sides (right and lift sides in the Figure) of the horn support 28, the vibrational energy from the vibration-generating source 26 that is positioned on the capillary side of the horn support 28 has no need to pass through the horn support 28. Accordingly, needless movement of the horn support 28 caused by the transfer of energy to the capillary 21 can be reduced. Furthermore, since fluctuations in the characteristics of the vibration-generating sources 26 and 27 themselves can be almost symmetrical on both sides of the horn support 28, the effect of such fluctuations on the horn support 28 can be reduced.

In the embodiment described above, each one of the vibration-generating sources 26 and 27 installed on both sides of the horn support 28 comprises two vibration elements as seen from the drawings. However, in order to make the symmetry of the fluctuations in characteristics on both sides of the horn support 28 more effective, the number and positions of installation of the vibration elements can be changed depending upon the required output.

Figure 3:
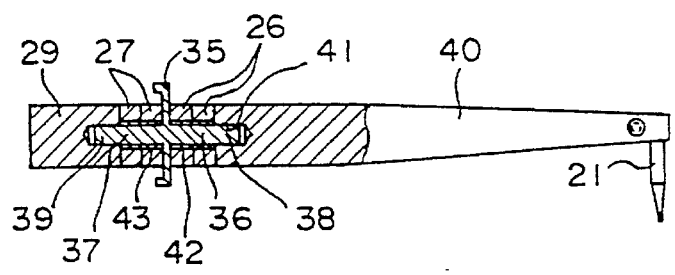
FIG. 3 is a cross section of essential portions of a second embodiment of the ultrasonic horn of a bonding apparatus according to the present invention.
Figure 4:
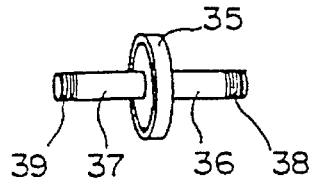
FIG. 4 is a perspective view of the horn used in the embodiment shown in FIG. 3.

FIGS. 3 and 4 illustrate a second embodiment of the present invention.

In this embodiment, as best seen in FIG. 4, a horn support 35 which is fastened to the bonding arm 30 (not shown in FIG. 3 but in FIG. 1) has vibration-generating source attachment shafts 36 and 37 on both sides or on the front and back sides, and external threaded portions 38 and 39 are formed at the ends of the vibration-generating source attachment shafts 36 and 37. The horn body 40, which has a capillary 21 at one (or front) end, has an internal threaded portion 41 on the other end. The internal threaded portion 41 of the horn body 40 is engaged with the outer threaded portion 38 of the attachment shaft 36 of the horn support 35. Insulating pipes 42 and 43 are fitted over the vibration-generating source attachment shafts 36 and 37. When the vibration-generating source 26 is provided on the insulating pipe 42 and the external threaded portion 38 is screwed into the internal threaded portion 41 and the horn support 35 is turned and tightened, the vibration-generating source 26 is secured in place on the attachment shaft 36. In addition, the vibration-generating source 27 is fitted over the insulating pipe 43 that is fitted over the attachment shaft 37, and a nut 29 is tightened onto the external threaded portion 39 of the attachment shaft 37. Thus, the vibration-generating source 27 is secured in place on the attachment shaft 37. Thus, the vibration-generating sources 26 and 27 are provided in the horn body 40.

Figure 2:
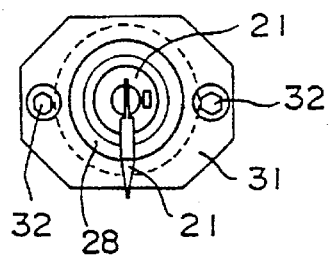
FIG. 2 is a front view thereof.

In the first embodiment shown in FIGS. 1 and 2, the horn support 28 is connected to the horn body 22 with the vibration-generating sources 26 and 27 on both sides of the horn support 28. Accordingly, slipping might occur between the horn support 28 and the vibration-generating sources 26 and 27 when a force is applied during bonding. In the second embodiment shown in FIGS. 3 and 4, on the other hand, the horn support 35 is firmly secured to the horn body 40 by direct mechanical means (or via a screw connection). Accordingly, no slipping of the horn support 35 is expected. The horn support 35 can act as a vibrational node and show a large strain. Accordingly, it is desirable that the threaded portions 38 and 39 be formed as close to where the vibrational node occurs as possible. If the threaded portions 38 and 39 are formed so that the distance of these portions from the horn support 35 is equal to approximately ¼ of the wavelength, the vibrational characteristics of the vibration-generating sources 26 and 27 can be improved.

Figure 5:
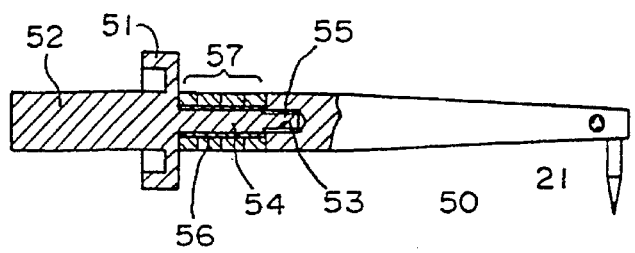
FIG. 5 is a cross section of essential portions of a third embodiment of the ultrasonic horn of a bonding apparatus according to the present invention.

FIG. 5 illustrates a third embodiment of the present invention.

In this embodiment, the horn body 50 comprises a front horn element 50 that has a capillary 21 at one end and a rear horn element 52 that has a horn support 51. A threaded portion 53 is internally formed in the opposite end of the front horn element 50 from the capillary 21. The rear horn element 52 has a vibration-generating source attachment shaft 54 and an external threaded portion 55. The external threaded portion 55 is formed at the end of the vibration-generating source attachment shaft 54 and is screwed into the internal threaded portion 53. An insulating pipe 56 is fitted over the vibration-generating source attachment shaft 54, and a vibration-generating source 57 is provided on the insulating pipe 56. Then, the assembly thus obtained is tightened by screwing the external threaded portion 55 of the rear horn element 52 into the internal threaded portion 53 of the front horn element 50. Thus, the vibration-generating source 57 is provided on the horn body 50.

In the previous two embodiments, two vibration-generating sources 26 and 27 are provided on both sides of the horn support 28 or the horn support 35. In the present embodiment shown in FIG. 5, on the other hand, one vibration-generating source 57 is provided so as to be located only on one side of the horn support 51. In other words, the vibration-generating source 57 is provided only between the horn support 51 and the capillary 21. An effect equal to that obtained in the embodiments are obtained using this construction as well.

Figure 6:
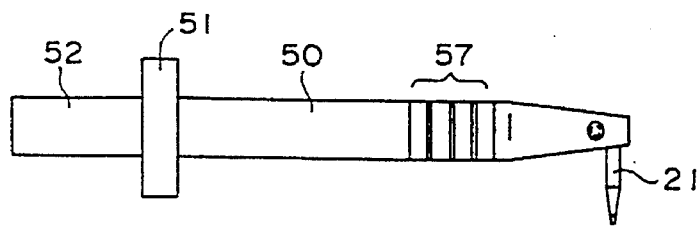
FIG. 6 is a side view of a fourth embodiment of the ultrasonic horn of a bonding apparatus according to the present invention.
Figure 7:
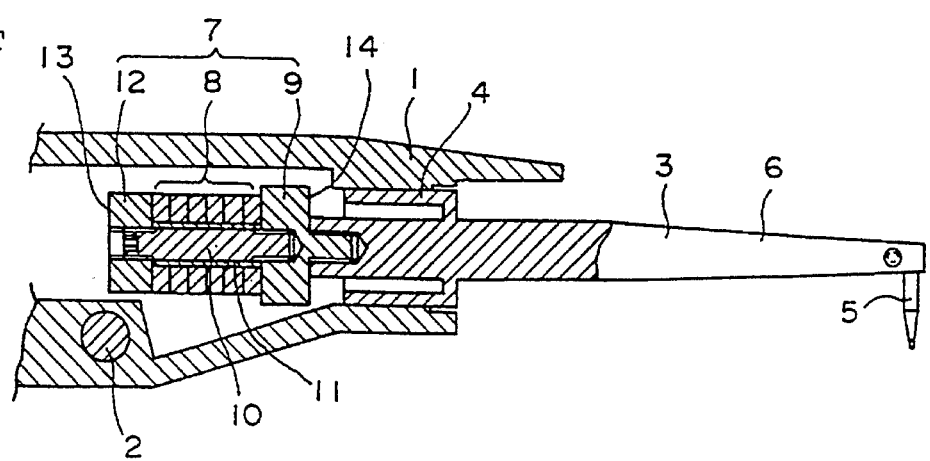
FIG. 7 is a cross section of essential portions of the ultrasonic horn of a conventional bonding apparatus.

FIG. 6 illustrates a fourth embodiment of the present invention.

In this embodiment, the vibration-generating source 57 (comprising four vibration elements as seen from the FIG. 6) is provided on the horn body 50 at a position closer to the capillary 21 than to the horn support 51. Thus, the difference between the fourth embodiment and the third embodiment is whether or not the vibration-generating source 57 is provided in the vicinity of the horn support 51. An effect equal to that obtained in the previous embodiments can be obtained using this construction as well.

In each one of four embodiments described above, the present invention is applied to a nailhead ultrasonic wave/heat-and-pressure bonding type wire bonding apparatus, and therefore, the bonding tool used is the capillary 21 through which a bonding wire is passed. However, it goes without saying that the present invention is applicable to an ultrasonic wedge type wire bonding apparatus too, and in this case the bonding tool is a wedge with a wire passing through it. The present invention can be further applied to a single tab bonding apparatus that uses a tool which connects tab leads to semiconductor elements one at a time.

In the present invention, the vibration-generating sources are provided on both sides of or on one side of the horn support. Accordingly, the bonding stability can be high.

Furthermore, in the embodiment shown in FIGS. 3 and 4, the horn support is firmly fastened to the horn body by direct mechanical means (or screwing), and the horn support is free of slipping.

We claim:

1. A bonding apparatus for a semiconductor device processing comprising a bonding arm, an ultrasonic horn mounted to said bonding arm, a bonding tool provided at one end of said ultrasonic horn and a vibration-generating source provided at an other end of said ultrasonic horn, and wherein said bonding apparatus further comprises a horn support that is used for mounting said ultrasonic horn to said bonding arm, said horn support comprising vibration-generating source attachment shafts on both sides and threaded portions formed at end portions of said attachment shafts, said vibration-generating sources are provided on said attachment shafts and located on both sides of said horn support, and one of said threaded portions is screw connected to said ultrasonic horn.

2. A bonding apparatus according to claim 1, wherein said vibration-generating source is selected from the group consisting of a piezoelectric element, an electrostrictive strain element and a magnetostrictor.

3. A bonding apparatus for semiconductor device processing comprising:

a bonding arm;

an ultrasonic horn;

an ultrasonic horn support for mounting one end of said ultrasonic horn to said bonding arm;

a bonding tool provided at an other end of said ultrasonic horn; and two ultrasonic vibration generating means with one of said two ultrasonic vibration generating means provided on each side of said ultrasonic horn support; and wherein said ultrasonic horn support comprises a mounting portion for mounting to said bonding arm and two threaded portions integrally formed with said mounting portion with each of said two threaded portions extending in opposite directions from said mounting portion, one of said two threaded portions extending through one of said ultrasonic vibration generating means and directly threaded into said ultrasonic horn and an other one of said two threaded portions for directly mounting an other one of said two ultrasonic vibration generating means.

* * * * *

UNITED STATES PATENT AND TRADEMARK OFFICE
CERTIFICATE OF CORRECTION

PATENT NO. : 5,486,733
DATED : January 23, 1996
INVENTOR(S) : Nobuto Yamazaki, et al.

It is certified that error appears in the above-indentified patent and that said Letters Patent is hereby corrected as shown below:

On title page,

Item [75] Inventors: Change "Nobuto Yamazaki, Higashi; Ryuichi Kyomasu, Kodaira, both of Japan", to --NOBUTO YAMAZAKI; RYUICHI KYOMASU, BOTH OF TOKYO, JAPAN--

Signed and Sealed this

Twenty-third Day of April, 1996

Attest:

BRUCE LEHMAN

Attesting Officer

Commissioner of Patents and Trademarks